US011101219B2

(12) United States Patent
Bruley et al.

(10) Patent No.: US 11,101,219 B2
(45) Date of Patent: Aug. 24, 2021

(54) LOW RESISTANCE CONTACTS INCLUDING INTERMETALLIC ALLOY OF NICKEL, PLATINUM, TITANIUM, ALUMINUM AND TYPE IV SEMICONDUCTOR ELEMENTS

(71) Applicant: INTERNATIONAL BUSINESS MACHINES CORPORATION, Armonk, NY (US)

(72) Inventors: John Bruley, Poughkeepsie, NY (US); Jack O. Chu, Manhasset Hills, NY (US); Kam-Leung Lee, Putnam Valley, NY (US); Ahmet S. Ozcan, San Jose, CA (US); Paul M. Solomon, Yorktown Heights, NY (US); Jeng-bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/258,041

(22) Filed: Jan. 25, 2019

(65) Prior Publication Data

US 2019/0157203 A1 May 23, 2019

Related U.S. Application Data

(63) Continuation of application No. 15/257,267, filed on Sep. 6, 2016, now Pat. No. 10,269,714.

(51) Int. Cl.
*H01L 21/768* (2006.01)
*H01L 23/535* (2006.01)
(Continued)

(52) U.S. Cl.
CPC ............ *H01L 23/535* (2013.01); *C22C 30/00* (2013.01); *H01L 21/2855* (2013.01);
(Continued)

(58) Field of Classification Search
CPC ................. H01L 23/535; H01L 23/485; H01L 21/76843; H01L 21/28518;
(Continued)

(56) References Cited

U.S. PATENT DOCUMENTS 5,290,480 A * 3/1994 Garg ...................... C21D 1/763
252/375
5,744,395 A 4/1998 Shue et al.
(Continued)

OTHER PUBLICATIONS

"What is E-beam Evaporation?" by Hughes—Semicore Equipment, Inc. Jun. 15, 2016.*
(Continued)

*Primary Examiner* — Marcos D. Pizarro
*Assistant Examiner* — Sue Tang
(74) *Attorney, Agent, or Firm* — Tutunjian & Bitetto, P.C.; Kurt Goudy

(57) ABSTRACT

A method of forming a contact to a semiconductor device is provided that forms an alloy composed of nickel (Ni), platinum (Pt), aluminum (Al), titanium (Ti) and a semiconductor material. The methods may include forming a nickel and platinum semiconductor alloy at a base of a via. A titanium layer having an angstrom scale thickness is deposited in the via in contact with the nickel platinum semiconductor alloy. An aluminum containing fill is deposited atop the titanium layer. A forming gas anneal including an oxygen containing atmosphere is applied to the structure to provide a contact alloy comprising nickel, platinum, aluminum, titanium and a semiconductor element from the contact surface of the semiconductor device.

18 Claims, 5 Drawing Sheets

(51) Int. Cl.
  *H01L 23/532* (2006.01)
  *H01L 29/78* (2006.01)
  *C22C 30/00* (2006.01)
  *H01L 23/485* (2006.01)
  *H01L 21/285* (2006.01)

(52) U.S. Cl.
  CPC .. *H01L 21/28518* (2013.01); *H01L 21/76805* (2013.01); *H01L 21/76843* (2013.01); *H01L 21/76846* (2013.01); *H01L 21/76858* (2013.01); *H01L 21/76864* (2013.01); *H01L 21/76895* (2013.01); *H01L 23/485* (2013.01); *H01L 23/53223* (2013.01); *H01L 23/53266* (2013.01); *H01L 29/7851* (2013.01); *H01L 23/53209* (2013.01); *H01L 23/53238* (2013.01); *H01L 23/53252* (2013.01)

(58) Field of Classification Search
  CPC ......... H01L 23/53223; H01L 21/76858; H01L 21/2855; H01L 23/53266; H01L 29/7851; H01L 21/76805; H01L 21/76846; H01L 21/76864; H01L 21/76895; H01L 23/53238; H01L 23/53252; H01L 23/53209; C22C 30/00
  See application file for complete search history.

(56) References Cited

U.S. PATENT DOCUMENTS

| | | | |
|---|---|---|---|
| 5,877,077 A | 3/1999 | Kronlund | |
| 6,531,396 B1 | 3/2003 | Chi et al. | |
| 6,599,644 B1 | 7/2003 | Zekentes et al. | |
| 7,718,500 B2 | 5/2010 | Chong et al. | |
| 8,148,786 B2 | 4/2012 | Kavalieros et al. | |
| 8,759,208 B2 | 6/2014 | Yan | |
| 10,269,714 B2 * | 4/2019 | Bruley | H01L 23/535 |
| 2002/0182836 A1 | 12/2002 | Agnello et al. | |
| 2006/0181198 A1 * | 8/2006 | Gotoh | H01L 27/12 |
| | | | 313/503 |
| 2007/0120218 A1 * | 5/2007 | Hsu | H01L 23/5256 |
| | | | 257/529 |
| 2007/0210448 A1 * | 9/2007 | Wong | H01L 21/288 |
| | | | 257/734 |
| 2012/0119302 A1 | 5/2012 | Pei et al. | |
| 2012/0196432 A1 | 8/2012 | Yan | |
| 2013/0193577 A1 | 8/2013 | Tseng et al. | |
| 2014/0264634 A1 | 9/2014 | Lee | |
| 2014/0264825 A1 | 9/2014 | Ahmed | |
| 2015/0221740 A1 * | 8/2015 | Alptekin | H01L 29/456 |
| | | | 257/288 |
| 2016/0163551 A1 | 6/2016 | Duong et al. | |

OTHER PUBLICATIONS

U.S. Office Action issued in U.S. Appl. No. 16/168,092 dated Aug. 28, 2020, pp. 1-10.
U.S. Notice of Allowance issued in U.S. Appl. No. 16/168,092 dated Dec. 15, 2020, pp. 1-17.
"What is E-Beam Evaporation?" by Matt Hughes—President—Semicore Equipment, Inc. (Jun. 15, 2016) pp. 1-2.
List of IBM Patents or Patent Applications Treated as Related dated Jan. 25, 2019, 2 pages.
Yu, C. et al., "Investigation of the Al/TiSi2/Si contact system" J. Appl. Phys. (Feb. 1983) pp. 937-943, vol. 54, No. 2.
U.S. Final Office Action issued in U.S. Appl. No. 16/168,092, dated Mar. 27, 2020, pp. 1-15.

* cited by examiner

LOW RESISTANCE CONTACTS INCLUDING INTERMETALLIC ALLOY OF NICKEL, PLATINUM, TITANIUM, ALUMINUM AND TYPE IV SEMICONDUCTOR ELEMENTS

BACKGROUND

Technical Field

The methods and structures described herein relate to contact structures and structures for transmitting electrical current.

Description of the Related Art

Modern integrated circuits are made up of literally millions of active devices such as transistors and capacitors. These devices are initially isolated from one another but are later interconnected together to formed functional circuits. The quality of the interconnection structure drastically affects the performance and reliability of the fabricated circuit. Interconnects and contacts are typically formed to bring and transmit electrical signals to semiconductor devices.

SUMMARY

In one embodiment, a method of forming a contact to a semiconductor device is provided that forms an alloy composed of nickel (Ni), platinum (Pt), aluminum (Al), titanium (Ti) and a semiconductor material, such as silicon (Si). In one embodiment, the methods includes forming a nickel and platinum semiconductor alloy at a base of a via open atop a contact surface to a semiconductor device. A titanium layer having an angstrom scale thickness is conformally deposited in the via opening in contact with the nickel platinum semiconductor alloy. An aluminum containing fill is deposited atop the titanium layer. In a following step, an anneal is applied to the material stack to provide a contact alloy comprising nickel, platinum, aluminum, titanium and a semiconductor element from the contact surface of the semiconductor device.

In another embodiment, the method of forming a contact to a semiconductor device can include further include a metal nitride layer that is formed within the via opening and a second metal fill atop the metal nitride layer. In one embodiment, the method includes forming a nickel platinum semiconductor alloy at a base of a via opening atop a contact surface of a semiconductor device. A titanium layer having an angstrom scale thickness can be conformally deposited in the via opening in contact with the nickel platinum semiconductor alloy. An aluminum containing fill is deposited atop the titanium layer in a lower portion of the via opening. A metal nitride layer and metal containing contact is deposited to substantially fill the via opening. In a following step, an anneal is applied to the material stack to provide a contact alloy comprising nickel, platinum, aluminum, titanium and a semiconductor element from the contact surface of the semiconductor device.

In another aspect, a contact to a semiconductor device is provided. In one embodiment, the contact to the semiconductor device is to the contact surface of at least one of a source region and drain region of a semiconductor device. A nickel, platinum, aluminum and titanium including intermetallic contact region is alloyed with the source/drain region contact semiconductor surface. A via contact is in contact with the intermetallic contact region, wherein the via contact includes a conformal titanium layer present on the intermetallic contact and a metal containing fill present on the conformal titanium layer.

BRIEF DESCRIPTION OF DRAWINGS

The following description will provide details for some embodiments for the methods and structures provided herein with reference to the following figures wherein.

DETAILED DESCRIPTION OF PREFERRED EMBODIMENTS

Figure 1:
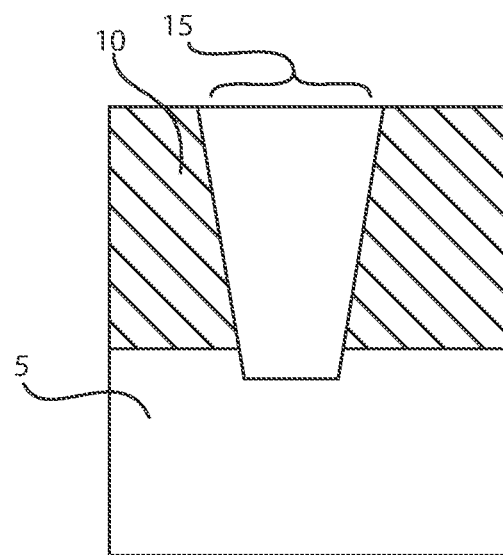
FIG. 1 is a side cross-sectional view depicting a via opening through a dielectric layer to the contact surface of a source/drain region.

Detailed embodiments of the claimed structures and methods are described herein; however, it is to be understood that the described embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details described herein are not to be interpreted as limiting, but merely as a representative basis for teaching one skilled in the art to variously employ the methods and structures of the present description. For purposes of the description hereinafter, the terms "upper", "lower", "right", "left", "vertical", "horizontal", "top", "bottom", and derivatives thereof shall relate to the embodiments of the described methods and structures, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

With increasing scaling for next generation complementary metal oxide semiconductor (CMOS) devices, the middle of the line (MOL) resistance can affect device performance. It has been determined that in order to overcome the MOL high resistance issues, that in some embodiments, the high-resistance interface between the contact to the source and drain regions (CA) contact, and the trench silicon (TS) contact can play a critical role.

In some embodiments, the methods and structures that are described herein provide a novel method to form a lower-resistance contact to the source and drain regions by forming contact region on the source and drain regions of the semiconductor device comprising nickel, platinum, aluminum, titanium and a semiconductor element from the contact surface of the source/drain region of the semiconductor device. Some embodiments of the methods and structures provided herein, are now described in more detail with reference to FIGS. 1-10.

FIG. 1 depicts one embodiment of a via opening 15 through a dielectric layer 10 to the contact surface 5 of a semiconductor device. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. The methods and structures are suitable to many types of semiconductor devices, such as planar semiconductor devices, e.g., field effect transistors (FETs); fin type field effect transistors (FinFETs); bipolar junction transistors and other related types of semiconductor devices. In some embodiments, the contact surfaces 5 that the contacts that are described herein are in electrical communication with can be the source/drain regions of a semiconductor device, or a gate region of a semiconductor device.

The contact surfaces 5 of the semiconductor devices are typically composed of a semiconductor material. For example, the contact surfaces 5 may be composed of a type IV semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. In some examples, the contact surfaces 5 may be source/drain regions composed of silicon (Si) or silicon germanium (SiGe). In the instances in which the contact surfaces 5 are the source/drain regions of a semiconductor device, the base semiconductor material of the contact surfaces 5 can be doped with an n-type or p-type conductivity dopant, i.e., depending on the conductivity type of the semiconductor device, e.g., if the semiconductor device is an n-type or p-type field effect transistor (FET).

The dielectric layer 10 that is present atop the contact surface 5 that the via opening 15 is formed through may be blanket deposited atop the entirety of the semiconductor device that includes the contact surface 5. The dielectric layer 10 may be an oxide, nitride or oyxnitride material. In some instances, the dielectric layer 10 may be referred to as interlevel dielectric or an intralevel dielectric. In some embodiments, the dielectric layer 10 is be selected from the group consisting of silicon containing materials, such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The dielectric layer 10 may be deposited using chemical vapor deposition (CVD) or spin on deposition. Following deposition, the upper surface of the dielectric layer 10 can be planarized, using a planarization process, such as chemical mechanical planarization (CMP).

Still referring to FIG. 1, via openings 15 can be formed through the dielectric layer 10 to expose the contact surfaces 5 of the semiconductor devices, e.g., contact surfaces of the source and drain region portions of the semiconductor devices. The via openings 15 may be formed using photolithography and etch processes. Specifically, and in one example, a etch mask pattern is produced by applying a photoresist to the surface to be etched, exposing the photoresist to a pattern of radiation, and then developing the pattern into the photoresist utilizing a resist developer. Once the patterning of the photoresist is completed, the sections of the dielectric layer 10 covered by the photoresist are protected, while the exposed regions are removed using a selective etching process that removes the unprotected regions to form the via openings 15. The etch process may be reactive ion etch (RIE), which can be selective to the contact surface 5.

Figure 2:
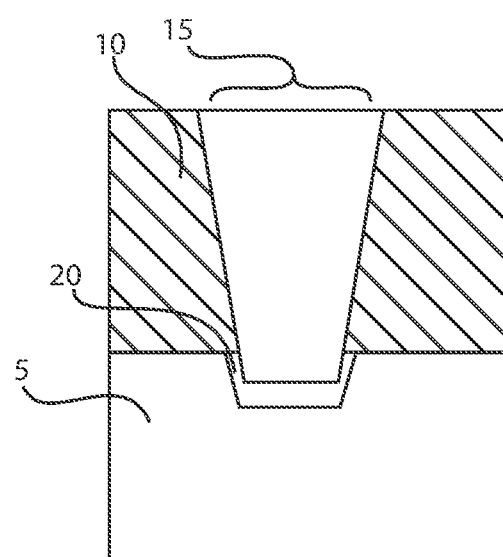
FIG. 2 is a side cross-sectional view depicting forming a nickel and platinum containing alloy with a semiconductor element at a base of the via opening.

FIG. 2 depicts forming a nickel (Ni) and platinum (Pt) containing alloy 20 with a semiconductor element at a base of the via opening 15. In the embodiments, in which the contact surface 5 is composed of silicon (Si), the semiconductor element that alloys with the nickel (Ni) and platinum (Pt) may be silicon (Si), in which the alloy is a silicide, such as nickel platinum silicide (NiPtSi). In the embodiments, in which the semiconductor element at the base of the via opening 15 include germanium (Ge), such as silicon germanium (SiGe), the alloy formed with the nickel (Ni) and platinum (Pt) can be a metal germanosilicide, e.g., the alloy may include nickel (Ni), platinum (Pt), germanium (Ge), and in some instances silicon (Si).

In some embodiments, the process for forming the nickel (Ni) and platinum (Pt) containing alloy 20 with a semiconductor element at a base of the via opening 15 may include depositing a metal layer including nickel (Ni) and platinum (Pt) within the via opening 15. The metal layer of nickel (Ni) and platinum (Pt) can be deposited using physical vapor deposition (PVD), chemical vapor deposition (CVD) or atomic layer deposition (ALD) methods. In one example, in which the metal layer of nickel (Ni) and platinum (Pt) is deposited by physical vapor deposition (PVD) method, the deposition process can include sputtering. Examples of sputtering apparatus that can be suitable for depositing the metal layer including nickel (Ni) and platinum (Pt) within the via opening 15 include DC diode type systems, radio frequency (RF) sputtering, magnetron sputtering, and ionized metal plasma (IMP) sputtering. In another example, the metal layer including nickel (Ni) and platinum (Pt) within the via opening 15 using plating processes, such as electroplating or electroless plating. In the embodiments, in which the metal layer including nickel (Ni) and platinum (Pt) is deposited within the via opening 15 using chemical vapor deposition (CVD), the chemical vapor deposition (CVD) process may be selected from the group consisting of Atmospheric Pressure CVD (APCVD), Low Pressure CVD (LPCVD) and Plasma Enhanced CVD (PECVD), Metal-Organic CVD (MOCVD) and combinations thereof may also be employed. It is noted that the aforementioned examples of deposition processes are provided for illustrative purposes only, and are not intended to limit the present description, as other deposition processes may be equally applicable, so long as enough material may be deposited within the via opening for the deposited metals to interact with the semiconductor material of the contact surface during the subsequently described annealing steps.

Following deposition of the metal layer including nickel (Ni) and platinum (Pt) within the via opening 15, an anneal process can be applied to interdiffuse the metal elements from the metal layer including nickel (Ni) and platinum (Pt) deposited within the via opening 15 with the semiconductor elements of the contact surface 5 of the semiconductor device at the base of the via opening 15 to form the metal semiconductor alloy. For example, the annealing process provides a nickel (Ni) and platinum (Pt) containing alloy 20 with a semiconductor element, e.g., silicide (nickel platinum silicide (NiPtSi) and/or metal germinicide, at a base of the via opening 15. In some embodiments, the annealing process can include furnace annealing, rapid thermal annealing (RTA) and/or pulsed laser annealing. The temperature and time of the anneal process is selected so the deposited metal, e.g., metal layer including nickel (Ni) and platinum (Pt), reacts with the semiconductor material of the contact surface, e.g., type IV semiconductor (e.g., silicon (Si), germanium (Ge), and/or silicon germanium (SiGe)) forming a metal semiconductor, e.g., silicide, such as nickel platinum silicide (NiPtSi) or nickel platinum germanosilicide. For example, the annealing temperature may range from 300° C. to 750° C., and the time period for the anneal may range from the millisecond range, e.g., 1 millisecond, to on the order of minute, such as 15 minutes, particularly depending upon the anneal process, e.g. laser annealing vs. furnace annealing. Following formation of the metal semiconductor alloy, the unreacted metal can be removed by a selective etch.

The aforementioned process conditions can be modified to provide a metal semiconductor alloy region having a thickness of less than 15 nm, e.g., 10 nm or less. In one example, the thickness of the nickel (Ni) and platinum (Pt) containing alloy 20 with a semiconductor element, e.g., silicide (nickel platinum silicide (NiPtSi) and/or metal germinicide, at a base of the via opening 15 ranges from 1 nm to 10 nm. In another example, the thickness of the nickel (Ni) and platinum (Pt) containing alloy 20 with a semiconductor element, e.g., silicide (nickel platinum silicide (NiPtSi) and/or metal germinicide, at a base of the via opening 15 ranges from 2 nm to 5 nm.

Figure 3:
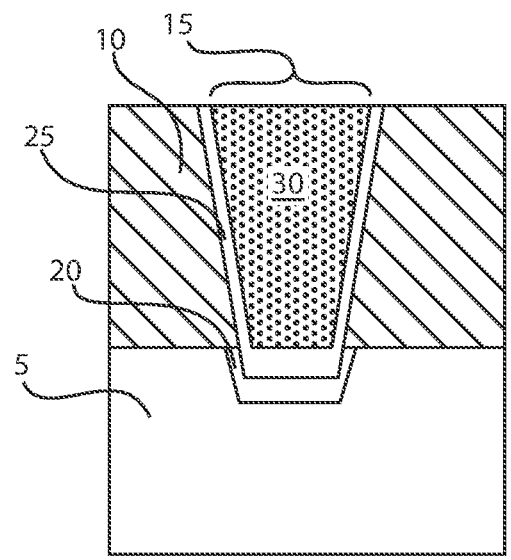
FIG. 3 is a side cross-sectional view depicting depositing a titanium layer having an angstrom scale thickness within the via opening in contact with the nickel platinum semiconductor alloy, wherein an aluminum fill is deposited atop the titanium layer.

FIG. 3 depicts one embodiment of depositing a titanium (Ti) layer 25 having an angstrom scale thickness that within the via in contact with the nickel platinum semiconductor alloy 20, wherein an aluminum containing fill 30 is deposited atop the titanium (Ti) layer 25. The titanium (Ti) layer 25 can be 95 wt. % titanium (Ti) or greater. In some embodiments, the titanium (Ti) layer 25 can be greater than 99 wt. % titanium (Ti). In yet other embodiments, the titanium (Ti) layer 25 can be 100 wt. % titanium (Ti). The titanium (Ti) layer 25 is a conformally deposited layer, in which the titanium (Ti) layer 25 is deposited on the sidewalls and base of the via opening 15. The term "conformal" denotes a layer having a thickness that does not deviate from greater than or less than 30% of an average value for the thickness of the layer. The titanium (Ti) layer 25 is deposited to an angstrom scale thickness. In some embodiments, the term "angstrom scale" means 150 Å or less. For example, the titanium (Ti) layer 25 can have a thickness of 100 Å or less. In some examples, the titanium (Ti) layer 25 may have a thickness of 95 Å, 90 Å, 85 Å, 80 Å, 70 Å, 60 Å, 50 Å, 40 Å, 30 Å, 20 Å, 15 Å, 10 Å, 5 Å or 1 Å, or may be equal to any range of thickness that includes one of the aforementioned values as an upper limit to the range, and one of the aforementioned values as a lower limit to the range.

The titanium (Ti) layer 25 can be deposited using a method that can provide the aforementioned purity of titanium and the aforementioned thicknesses. In one example, the titanium (Ti) layer 25 is deposited using thermal electron beam deposition, which may also be referred to as electron beam physical vapor deposition (EBPVD). In some examples, electron beam physical vapor deposition, or EBPVD, is a form of physical vapor deposition in which a target anode, i.e., a titanium (Ti) anode, is bombarded with an electron beam given off by a charged tungsten filament under high vacuum. In accordance with the present description, the electron beam of the EBPVD device causes atoms from a titanium target to transform into the gaseous phase. These atoms then precipitate into solid form, coating everything in the vacuum chamber (within line of sight) with a thin layer of the anode material, i.e., titanium (Ti). In the present example, the structure depicted in FIG. 3 is placed in the deposition chamber of the EBPVD process, hence forming the titanium (Ti) layer 25 on the exposed sidewalls of the via opening 15 and on the nickel platinum semiconductor alloy 20 at the base of the via opening 15. In some embodiments, the titanium (Ti) layer 25 is formed using an atomic layer deposition (ALD) process.

Still referring to FIG. 3, in some embodiments, following the formation of the titanium (Ti) layer 25, at least a portion of the via opening 15 is filled with an aluminum (Al) fill 30. The aluminum (Al) fill 30 can be 95 wt. % aluminum (Al) or greater. In some embodiments, the aluminum (Al) fill 30 can be greater than 99 wt. % aluminum (Al) or greater. In yet other embodiments, the aluminum (Al) fill 30 can be 100 wt. % aluminum (Al). The aluminum (Al) fill 30 can be deposited using any method suitable for filling the via opening 15. For example, the aluminum (Al) fill 30 can be deposited using physical vapor deposition (PVD), chemical vapor deposition (CVD) or atomic layer deposition (ALD) methods. In one example, in which the aluminum (Al) fill 30 is deposited within the via opening by physical vapor deposition (PVD) method, the deposition process may include sputtering, such as sputtering via DC diode type systems, radio frequency (RF) sputtering, magnetron sputtering, and ionized metal plasma (IMP) sputtering. In another example, the aluminum (Al) fill 30 is deposited within the via opening 15 using plating processes, such as electroplating or electroless plating. In the embodiments, in which the aluminum (Al) fill 30 is deposited within the via opening 15 using chemical vapor deposition (CVD), the chemical vapor deposition (CVD) process can be selected from the group consisting of Atmospheric Pressure CVD (APCVD), Low Pressure CVD (LPCVD) and Plasma Enhanced CVD (PECVD), Metal-Organic CVD (MOCVD) and combinations thereof may also be employed. It is noted that the aforementioned examples of deposition processes are provided for illustrative purposes only, and are not intended to limit the described methods and structures. In some embodiments, following deposition of the aluminum (Al) fill 30, the structure can be planarized, e.g., the structure can be planarized using a chemical mechanical planarization (CMP) process.

Figure 4:
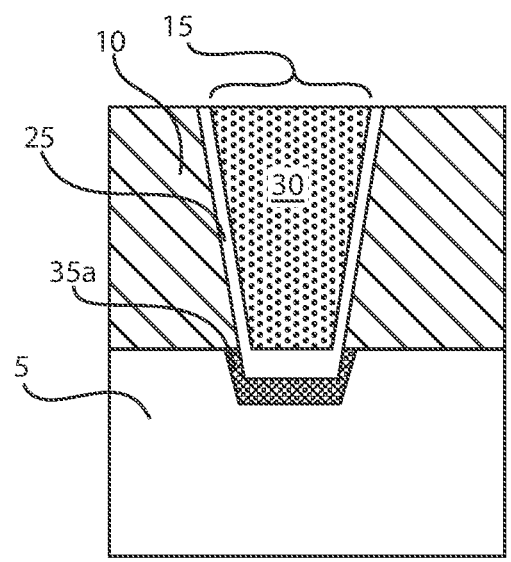
FIG. 4 is a side cross-sectional view depicting applying an anneal to the material stack depicted in FIG. 3 to provide a contact alloy composed of nickel, platinum, aluminum, titanium and a semiconductor element from the contact surface of the semiconductor device.

FIG. 4 depicts one embodiment of applying an anneal to the material stack depicted in FIG. 3 to provide a contact alloy 35a comprising nickel (Ni), platinum (Pt), aluminum (Al), titanium (Ti) and a semiconductor element from the contact surface 5 of the semiconductor device. For example, the contact alloy 35a may be Ni(Pt)—Ti—Al alloy with Si or SiGe. The anneal for forming the contact alloy 35a can be a forming gas anneal (FGA) to getter oxygen (O) and form the intermetallic alloy that provides the contact alloy 35a. A forming gas anneal (FGA) is a thermal process including an atmosphere that is a mixture of hydrogen and nitrogen. It is sometimes called a "dissociated ammonia atmosphere". In one embodiment, the forming gas anneal atmosphere includes a 5% $H_2$ in $N_2$. By gettering oxygen, the forming gas anneal (FGA) may reduce the formation of oxides on the contact alloy 35a composed of nickel (Ni), platinum (Pt), aluminum (Al), titanium (Ti) and a semiconductor element from the contact surface 5 of the semiconductor device. The forming gas anneal (FGA) may be conducted in a furnace. In some embodiments, the forming gas anneal (FGA) can include an elevated temperature ranging from 250° C. to 550° C. In some other embodiments, the forming gas anneal (FGA) can include an elevated temperature ranging from 300° C. to 500° C. In yet other embodiments, the forming gas anneal (FGA) ca include an elevated temperature ranging from 300° C. to 450° C., e.g., 350° C. to 450° C. The time period of the anneal may range from 1 minutes to 30 minutes. In one embodiment, the time period of the anneal may range from 10 minutes to 20 minutes. In one example, the forming gas anneal may include a time period of 15 minutes, at a temperature ranging from 350° C. to 450° C.

Applying the anneal described above to the structure depicted in FIG. 3 typically causes the titanium (Ti) from the titanium (Ti) layer 25, and the aluminum (Al) from the aluminum (Al) fill 30, to diffuse and intermix with the nickel (Ni) and platinum (Pt) containing alloy 20 to convert the nickel (Ni) and platinum (Pt) containing alloy 20 into the contact alloy 35a comprising nickel (Ni), platinum (Pt), aluminum (Al), titanium (Ti) and a semiconductor element from the contact surface 5 of the semiconductor device. In some embodiments, in which the contact surface 5 is composed of silicon (Si), the contact alloy 35a is composed of nickel (Ni), platinum (Pt), aluminum (Al), titanium (Ti), and silicon (Si). In some embodiments, the contact alloy 35a can be of the phase $(Al_xS_{1-z})_7Ni_3$. In some embodiments, the contact alloy 35a is composed of nickel (Ni) ranging from 20 at. % to 30 at. %, platinum (Pt) ranging from 0 at. % to 10 at. %, aluminum (Al) ranging from 40 at. % to 60 at. %, and silicon (Si) ranging from 5 at. % to 20 at. %. In some embodiments, because this phase does not contain titanium (Ti), during the anneal and phase formation, the titanium (Ti) may segregate to the interfaces above or below alloy 35a, as well as to grain boundaries within layer 35a. As a result chemical composition analysis of this layer may reveal the presence of Ti. In some embodiments, Ni is deposited with Pt (typically up to 10%).

In some embodiments, in which the contact surface 5 is composed of silicon germanium (SiGe), the contact alloy 35a is composed of nickel (Ni), platinum (Pt), aluminum (Al), titanium (Ti), silicon (Si) and germanium (Ge). In some embodiments, the contact alloy 35a is composed of nickel (Ni) ranging from 20 at. % to 30 at. %, platinum (Pt) ranging from 0 at. % to 10 at. %, aluminum (Al) ranging from 40 at. % to 60 at. %, silicon (Si) ranging from 5 at. % to 20 at. % and germanium (Ge) ranging from 0 at. % to 15 at. %.

The contact alloy 35a can have a thickness of 30 nm or less. In some examples, the contact alloy 35a may have a thickness ranging from 5 nm to 15 nm.

In some embodiments, the above described intermetallic contact alloy 35a composed of nickel (Ni), platinum (Pt), aluminum (Al), titanium (Ti) and a semiconductor element from the contact surface 5 of the semiconductor device can provide a contact, e.g., source/drain contact, having a very low specific contact resistivity, which can be below $1 \times 10^{-9}$ ohm/cm$^2$.

Figure 5:
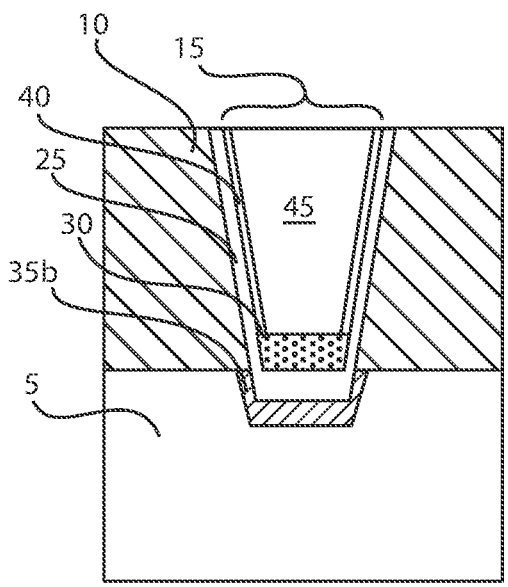
FIG. 5 is a side cross-sectional view depicting another embodiment of the present disclosure in which an aluminum fill is deposited atop the titanium layer in a lower portion of the via as depicted in FIG. 2, and a metal nitride layer and metal containing contact is deposited to substantially fill the via opening.
Figure 6:
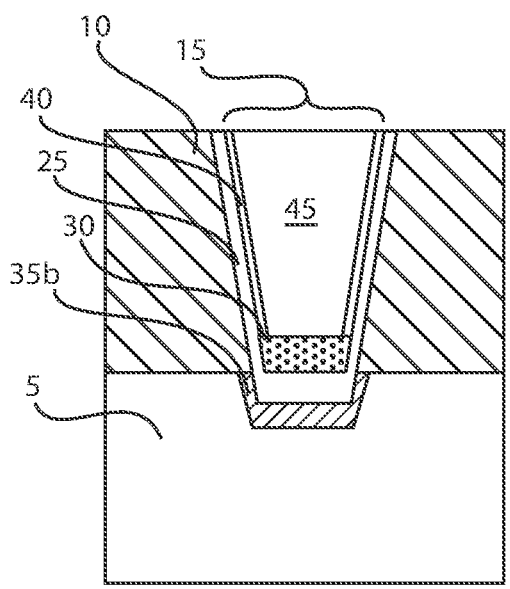
FIG. 6 is a side cross-sectional view depicting applying an anneal to the material stack depicted in FIG. 5 to provide a contact alloy comprising nickel, platinum, aluminum, titanium and a semiconductor element from the contact surface of the semiconductor device.

FIGS. 1, 2, 5 and 6 describe another embodiment of forming a contact in accordance with the present description. The contact structure depicted in FIGS. 1, 2, 5 and 6 is similar to the contact structure that is formed using the method described above with reference to FIGS. 1-4. In the embodiment that is described with reference to FIGS. 1, 2, 5 and 6 the contract further includes a metal nitride liner 40 and a metal fill 45 (also referred to as metal containing contact 45). Referring to FIG. 5, in accordance with one embodiment of the present description beginning with the structure depicted in FIG. 2, a titanium (Ti) layer 25 is first deposited in the via opening 15 including a portion at the base of the via opening 15 in contact with the nickel platinum semiconductor alloy 20. The titanium (Ti) layer 25 that is depicted in FIG. 5 is similar to the titanium (Ti) layer 25 depicted in FIG. 3. Therefore, the description of the titanium (Ti) layer 25 provided above with reference to FIG. 3 is suitable for describing at least one embodiment of the titanium (Ti) layer depicted in FIG. 5.

In a following step, the aluminum (Al) fill 30 is deposited in the via opening 15. The aluminum (Al) fill 30 depicted in FIG. 5 is similar to the aluminum (Al) fill 30 that is depicted in FIG. 3. Therefore, at least one embodiment of the aluminum (Al) fill 30 depicted in FIG. 5 has been described above with reference to FIG. 3. Different than the embodiment of the aluminum (Al) fill depicted in FIG. 3 that fills the entirety of the via opening, the aluminum (Al) fill 30 that is depicted in FIG. 5 only fills a lower portion of the via opening 15. The aluminum (Al) fill 30 that is depicted in FIG. 5 can be deposited to the correct height of the via opening 15, or the aluminum (Al) fill 30 can be deposited and then recessed to the correct height within the via opening 15 using a etch process, such as reactive ion etch (RIE).

Referring to FIG. 5, in one embodiment, a metal nitride layer 40 can be deposited on the exposed portions of the titanium (Ti) layer 25 that is present on the sidewalls of the via opening 15, and is deposited on the recessed portion of the aluminum (Al) fill 30 that is present in the lower portion of the via 15. In some embodiments, the metal nitride layer 40 is composed of titanium nitride (TiN). In other embodiments, the metal nitride layer 40 is composed of tantalum nitride (TaN), tungsten nitride (WN), aluminum nitride and combinations thereof. The metal nitride layer 40 is deposited using chemical vapor deposition (CVD) or physical vapor deposition (PVD) methods. In another example, the metal nitride layer 40 may be formed using atomic layer deposition (ALD). Examples of CVD suitable for forming the metal nitride layer 40 include plasma enhanced CVD. Examples of PVD suitable for forming the metal nitride layer 40 include plating or sputtering. The thickness of the metal nitride layer 40 can range from 1 nm to 10 nm. In some examples, the thickness of the metal nitride layer 40 may range from 1 nm to 5 nm.

Following formation of the metal nitride layer 40, the via openings 15 may be filled with a metal containing contact 45 of the interconnect being formed in the via openings 15. The metal containing contact 45 is typically composed of an electrically conductive material. For example, the metal containing contact 45 can be composed of tungsten (W). In other embodiments, the metal containing contact 45 is composed of a metal that is selected from cobalt (Co), ruthenium (Ru), titanium (Ti), aluminum (Al), copper (Cu) and combinations thereof. The electrically conductive material for the metal containing contact 45 may be deposited using chemical vapor deposition (CVD) or physical vapor deposition (PVD). Examples of CVD suitable for forming the metal containing contact 45 include metal organic chemical vapor deposition (MOCVD), plasma enhanced chemical vapor deposition (PECVD), and high density plasma (HDPCVD). Examples of PVD suitable for forming the metal containing contact 45 of the interconnect including plating, electroplating, electroless plating, sputtering and combinations thereof. The upper surface of the metal containing contact 45 can be planarized to be coplanar with the upper surface of the dielectric layer 10.

FIG. 6 depicts one embodiment of applying an anneal to the material stack depicted in FIG. 5 to provide a contact alloy 35b comprising nickel, platinum, aluminum, titanium and a semiconductor element from the contact surface 5 of the semiconductor device. For example, the contact alloy 35b can be Ni(Pt)—Ti—Al alloy with Si or SiGe. The anneal for forming the contact alloy 35b can be a forming gas anneal (FGA) to getter oxygen (O) and form the intermetallic alloy that provides the contact alloy 35b. In some embodiments, the forming gas anneal (FGA) may include an elevated temperature ranging from 250° C. to 550° C. In some other embodiments, the forming gas anneal (FGA) includes an elevated temperature ranging from 300° C. to 500° C. In yet other embodiments, the forming gas anneal (FGA) includes an elevated temperature ranging from 350° C. to 450° C. The time period of the anneal may range from 5 minutes to 30 minutes. In one embodiment, the time period of the anneal ranges from 10 minutes to 20 minutes. In one example, the forming gas anneal can include a time period of 15 minutes, at a temperature ranging from 350° C. to 450° C.

Applying the anneal described above to the structure depicted in FIG. 5 typically causes the titanium (Ti) from the titanium (Ti) layer 25, and the aluminum (Al) from the aluminum (Al) fill 30, to diffuse and intermix with the nickel (Ni) and platinum (Pt) containing alloy 20 to convert the nickel (Ni) and platinum (Pt) containing alloy 20 into the contact alloy 35b comprising nickel (Ni), platinum (Pt), aluminum (Al), titanium (Ti) and a semiconductor element from the contact surface 5 of the semiconductor device. In some embodiments, in which the contact surface 5 is composed of silicon (Si), the contact alloy 35b may be composed of nickel (Ni), platinum (Pt), aluminum (Al), titanium (Ti), and silicon (Si). In some embodiments, the contact alloy 35b can be of the phase $(Al_xSi_{1-x})_7Ni_3$. In some embodiments, the contact alloy 35b may be composed of nickel (Ni) ranging from 20 at. % to 30 at. %, platinum (Pt) ranging from 0 at. % to 10 at. %, aluminum (Al) ranging from 40 at. % to 60 at. %, and silicon (Si) ranging from 5 at. % to 20 at. %. In some embodiments, because this phase does not contain titanium (Ti), during the anneal and phase formation, the titanium (Ti) may segregate to the interfaces above or below alloy 35b, as well as grain boundaries within layer 35b. As a result chemical composition analysis of this layer may reveal the presence of Ti. In some embodiments, Ni may be deposited with Pt (typically up to 10%).

In some embodiments, in which the contact surface 5 is composed of silicon germanium (SiGe), the contact alloy 35b may be composed of nickel (Ni), platinum (Pt), aluminum (Al), titanium (Ti), silicon (Si) and germanium (Ge).

In some embodiments, in which the contact surface 5 is composed of silicon germanium (SiGe), the contact alloy 35b may be composed of nickel (Ni), platinum (Pt), aluminum (Al), titanium (Ti), silicon (Si) and germanium (Ge). In some embodiments, the contact alloy 35b may be composed of nickel (Ni) ranging from 20 at. % to 30 at. %, platinum (Pt) ranging from 0 at. % to 10 at. %, aluminum (Al) ranging from 40 at. % to 60 at. %, silicon (Si) ranging from 5 at. % to 20 at. % and germanium (Ge) ranging from 0 at. % to 15 at. %.

In some embodiments, the above described intermetallic contact alloy 35b that is depicted in FIG. 6 is composed of nickel (Ni), platinum (Pt), aluminum (Al), titanium (Ti) and a semiconductor element from the contact surface 5 of the semiconductor device can provide a contact, e.g., source/drain contact, having a very low specific contact resistivity, which can be below $1 \times 10^{-9}$ ohm/cm$^2$.

The contact structures, e.g., interconnect structures, that are depicted in FIGS. 1-6 may be employed in any electrical device. For example, the interconnect structures that are described herein may be present within electrical devices that employ semiconductors that are present within integrated circuit chips. The integrated circuit chips including the interconnects described herein may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Figure 7:
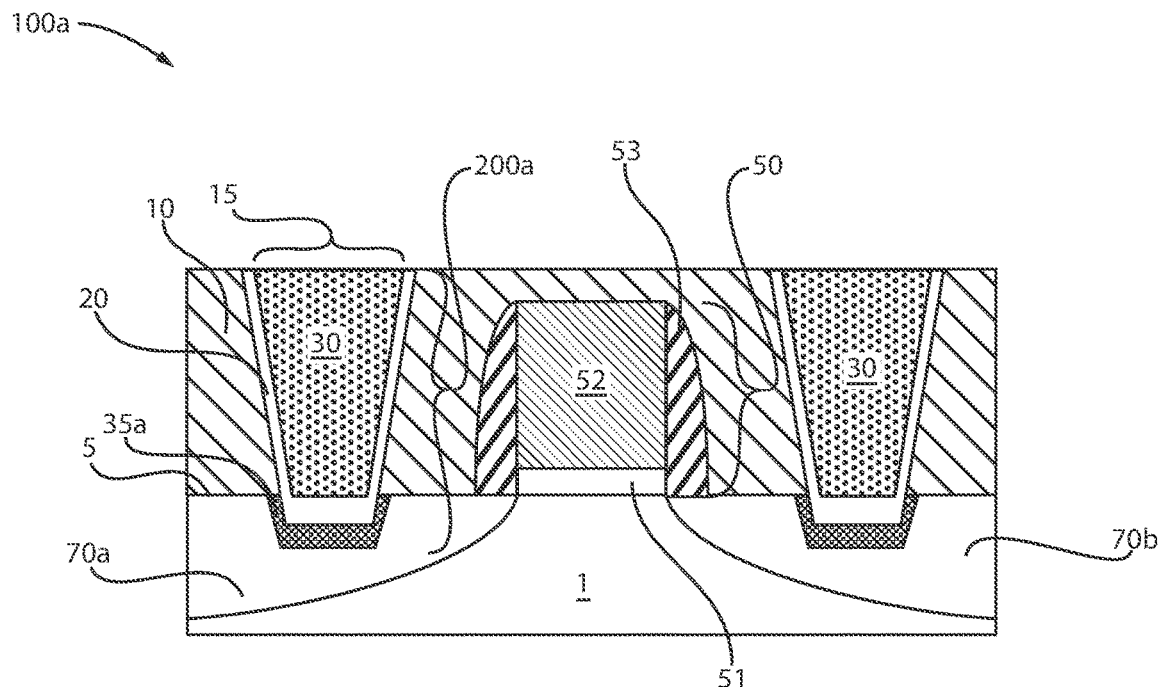
FIG. 7 is a side cross-sectional view of a field effect transistor (FET) including a contact to the source/drain regions of the semiconductor device including a nickel, platinum, aluminum and titanium including intermetallic contact region that is alloyed with the source/drain region contact semiconductor surface.

FIG. 7 depicts one embodiment of a field effect transistor (FET) 100a including a contact 200a to the source/drain regions 70a, 70b of the semiconductor device including a nickel, platinum, aluminum and titanium including intermetallic contact region 35a that is alloyed with the source/drain region contact semiconductor surface 5 (also referred to as contact alloy 35a comprising nickel (Ni), platinum (Pt), aluminum (Al), titanium (Ti) and a semiconductor element from the contact surface 5 of the semiconductor device). A "field effect transistor (FET)" is a semiconductor device in which the output current, i.e., source-drain current, is controlled by the voltage applied to the gate. A FET has three terminals, i.e., gate structure 50, source region 70a and drain region 70b. As used herein, the term "drain" means a doped region in semiconductor device located at the end of the channel, in which carriers are flowing out of the transistor through the drain. As used herein, the term "channel" is the region underlying the gate structure 50 and between the source and drain region 70a, 70b of a semiconductor device that becomes conductive when the semiconductor device is turned on. As used herein, the term "source" is a doped region in the semiconductor device, in which majority carriers are flowing into the channel.

The gate structure 50 is formed on the channel portion of the substrate 1 that the FET 100a is formed on. The gate structure 50 may include a gate dielectric 51, and a gate conductor 52. The gate structure 50 may be formed using gate first or gate last, i.e., replacement gate processing. In one embodiment, the gate dielectric 51 may be composed of silicon oxide, or a high-k dielectric material, such as hafnium oxide ($HfO_2$). The gate conductor 52 may be composed of a conductive material, such as a doped semiconductor, e.g., n-type doped polysilicon, or a metal, such as tungsten (W) or an n-type or p-type work function metal, e.g., titanium nitride.

Gate sidewall spacers 53 may be formed on the sidewalls of the gate structure 50. Following formation of the gate sidewall spacers 50, the source and drain regions 70a, 70b may be formed in the substrate 1. This can include ion implantation of n-type or p-type dopants into the substrate 1 and/or epitaxial growth of n-type or p-type semiconductor material on the source and drain region portions of the substrate 1.

Following formation of the source and drain regions 70a, 70b, the contacts 200a to the source and drain regions 70a, 70b may be formed. The contacts 200a are formed in a via opening 15 through a dielectric layer 10, and include a nickel, platinum, aluminum and titanium including intermetallic contact region 35a that is alloyed with the source/drain region contact semiconductor surface 5 (also referred to as contact alloy 35a comprising nickel (Ni), platinum (Pt), aluminum (Al), titanium (Ti) and a semiconductor element from the contact surface 5 of the semiconductor device). The contacts 200a depicted in FIG. 7 may be formed using methods described above with reference to FIGS. 1-4. Therefore, the above description of the dielectric layer 10, via opening 15 and the contact alloy 35a that is described with reference to FIGS. 1-4 is suitable for the dielectric layer 10, via opening 15 and the intermetallic contact region 35a that is depicted in FIG. 7. It is noted that the titanium (Ti) layer 25, and the aluminum (Al) fill that are depicted in FIG. 7 have been described above in the description of the structures depicted in FIGS. 1-4 having the same reference numbers.

Figure 8:
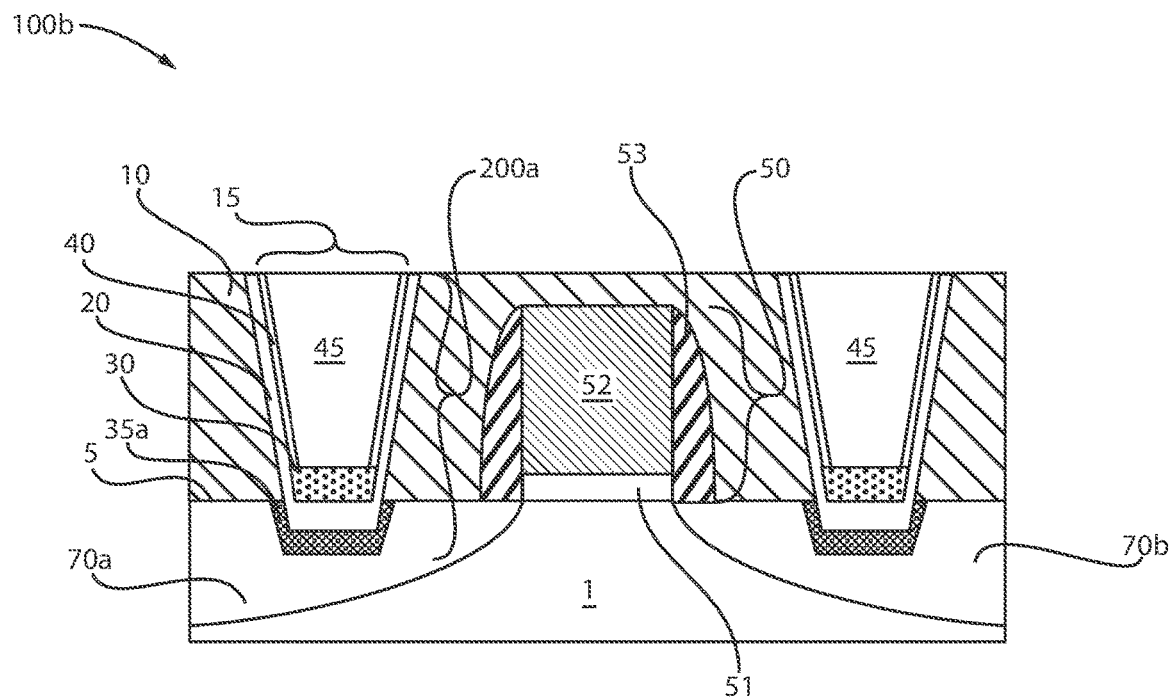
FIG. 8 is a side cross-sectional view of a field effect transistor (FET) including a contact formed in accordance with method described with reference to FIGS. 1-2 and 5-6.

FIG. 8 depicts another embodiment of a field effect transistor (FET) 100b that is similar to the field effect transistor (FET) 100a depicted in FIG. 7. The FET 100b depicted in FIG. 8 is different from the FET depicted in FIG. 7, because the FET 100a depicted in FIG. 7 has contacts 200a formed in accordance with the methods described with reference to FIGS. 1-4, and the contact 200b to the FET 100b depicted in FIG. 8 has been formed in accordance with the methods described with reference to FIGS. 1-2 and 5-6. Therefore, the features of the FET1 100b depicted in FIG. 8, such as the gate structure 50, source region 70a, and drain region 70b have been described in FIG. 7 by the description of the structures having the same reference numbers. The description of the elements of the contact 200b, such as the metal containing contact 45, the metal nitride layer 40, the aluminum fill 30, the titanium layer 25, and the contact alloy 35b can be provided by the description of the structures having the same reference numbers that are depicted in FIGS. 1-2 and 5-6.

Figure 9:
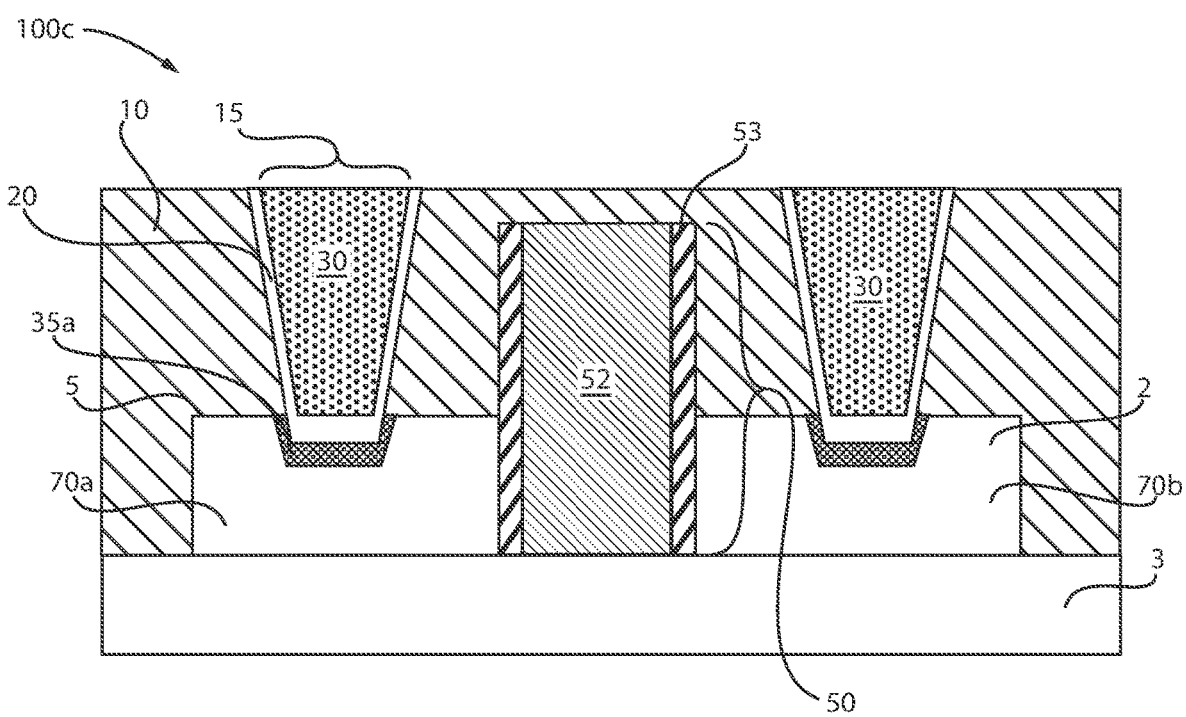
FIG. 9 is a side cross-sectional view of a fin type field effect transistor (FinFET) including a nickel, platinum, aluminum and titanium including intermetallic contact region that is alloyed with the source/drain region contact semiconductor surface.
Figure 10:
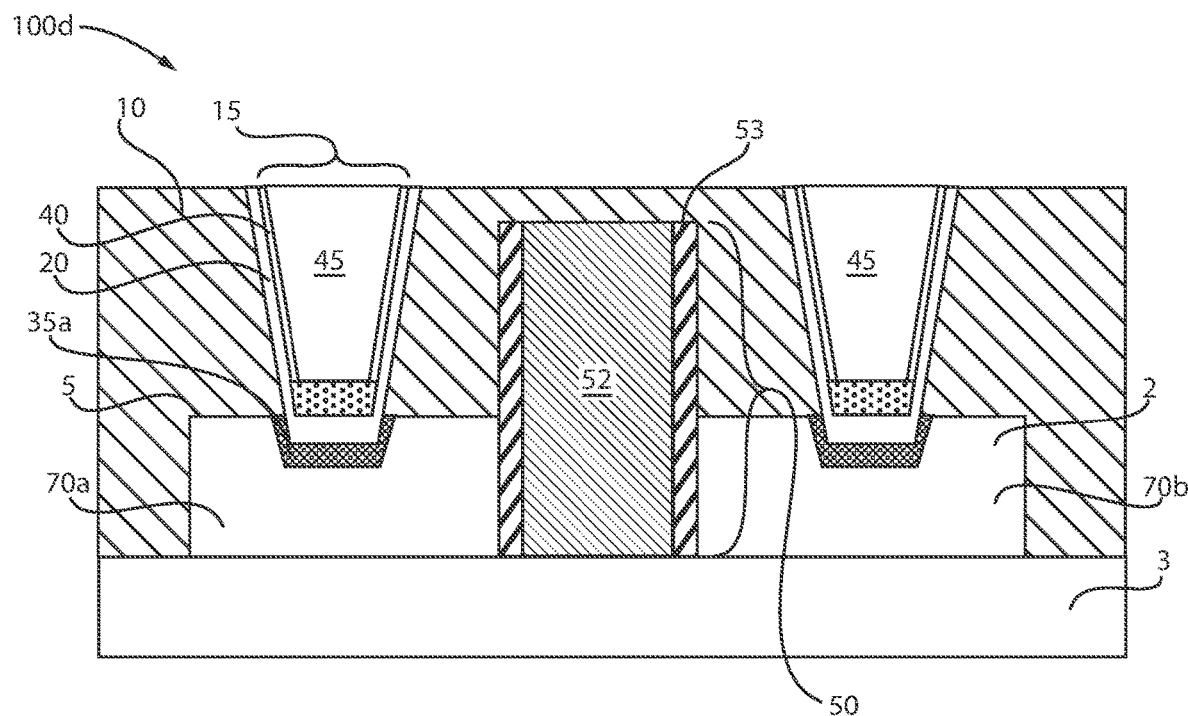
FIG. 10 is a side cross-sectional view of a fin type field effect transistor (FinFET) including a contact formed in accordance with method described with reference to FIGS. 1-2 and 5-6.

The structures depicted in FIGS. 7 and 8 are planar semiconductor devices. The present description is not limited to only these types of semiconductor devices. For example, the contacts 200a, 200b that are depicted in FIGS. 7 and 8 can be applied to the contact surface 5 of the source and drain regions 70a, 70b of Fin type Field Effect Transistors (FinFETs) 100c, 100d, as depicted in FIGS. 9 and 10. A FinFET includes a fin structure 2, which may be present on a supporting substrate 3. As used herein, a "fin structure" refers to a semiconductor material, which is employed as the body of a semiconductor device, in which the gate structure 50 is positioned around the fin structure 2 such that charge flows down the channel on the two sidewalls of the fin structure 2 and optionally along the top surface of the fin structure 2. The portions of the fin structure 2 adjacent on the opposing sides of the channel portion are the source and drain region portions of the fin structure 2. Source and drain regions 70a, 70b may be formed by ion implantation or by employing in situ epitaxial doped semiconductor material that is formed on the source and drain region portions of the fin structure 2. The gate structure 50 is similar to the gate structures 50 described in FIGS. 7 and 8 and includes at least one gate dielectric and a gate conductor 52. A gate sidewall spacer 53 may also be present on the sidewalls of the gate structure 50.

FIG. 9 depicts one embodiment of a fin type field effect transistor (FinFET) 100c including a contact 200a with a nickel, platinum, aluminum and titanium including intermetallic contact region 35a that is alloyed with the source/drain region contact semiconductor surface of the source and drain regions 70a, 70b of the FinFET 100c. The contacts 200a depicted in FIG. 9 may be formed using methods described above with reference to FIGS. 1-4. Therefore, the above description of the dielectric layer 10, via opening 15 and the contact alloy 35a that is described with reference to FIGS. 1-4 is suitable for the dielectric layer 10, via opening 15 and the intermetallic contact region 35a that is depicted in FIG. 9. It is noted that the titanium (Ti) layer 25, and the aluminum (Al) fill that are depicted in FIG. 9 have been described above in the description of the structures depicted in FIGS. 1-4 having the same reference numbers.

FIG. 10 depicts one embodiment of a fin field effect transistor (FinFET) 100d including a nickel, platinum, aluminum and titanium including intermetallic contact region 35b that is alloyed with the source/drain region contact semiconductor surface, wherein the contact further includes a metal nitride liner 40 and a metal containing fill 45 (also referred to as metal containing contact 45). The fin type field effect transistor (FinFET) 100d depicted in FIG. 10 includes a contact 200b formed in accordance with method described with reference to FIGS. 1-2 and 5-6. The description of the elements of the contact 200b, such as the metal containing contact 45, the metal nitride layer 40, the aluminum fill 30, the titanium layer 25, and the contact alloy 35b can be provided by the description of the structures having the same reference numbers that are depicted in FIGS. 1-2 and 5-6.

Having described preferred embodiments of a structure and method for forming LOW RESISTANCE CONTACTS INCLUDING INTERMETALLIC ALLOY OF NICKEL, PLATINUM, TITANIUM, ALUMINUM AND TYPE IV SEMICONDUCTOR ELEMENTS, it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a contact to a semiconductor device comprising:
   forming a nickel and platinum semiconductor alloy at a base of a via opening on a contact surface of the semiconductor device;
   forming a titanium layer having an angstrom scale thickness conformally deposited in the via opening in contact with the nickel platinum semiconductor alloy, wherein the titanium layer is in direct contact with a dielectric material of a sidewall of a via opening;
   depositing an aluminum containing fill atop the titanium layer; and
   applying an anneal to a material stack including the aluminum containing fill, the titanium layer and the nickel and platinum semiconductor alloy, the anneal including a dissociated ammonia atmosphere to getter oxygen, wherein said applying the anneal provides a contact alloy having elements selected from the group consisting of nickel, platinum, aluminum, titanium, silicon from the contact surface of the semiconductor device, and combinations thereof, wherein the contact alloy comprises aluminum in an amount greater than 40 at. % and said silicon in an amount ranging from 5 at. % to 20 at. %.

2. The method of claim 1, wherein the contact surface of the semiconductor device comprises a source/drain region comprising a type IV semiconductor selected from the group consisting of silicon, silicon germanium and a combination thereof.

3. The method of claim 2, wherein nickel and platinum semiconductor alloy is formed by a method comprising:
   depositing a nickel and platinum alloy atop a surface of the source/drain region comprised of the type IV semiconductor; and
   annealing the nickel and platinum alloy to interfuse metals from the nickel and platinum alloy with the type IV semiconductor to form said nickel platinum semiconductor alloy comprising a metal silicide, metal germanosilicide or a combination thereof.

4. The method of claim 3, wherein the depositing the nickel and platinum alloy comprises a deposition process selected from the group consisting of sputtering, plating, electroplating, electroless plating, atomic layer deposition (ALD), chemical vapor deposition (CVD) and combinations thereof.

5. The method of claim 2, wherein the titanium layer is deposited using e-beam physical vapor deposition.

6. The method of claim 5, wherein the titanium layer has a thickness of 100 Å or less.

7. The method of claim 1, wherein said annealing comprises a temperature ranging from 300° C. to 450° C., and a time period ranging from 1 minute to 20 minutes.

8. The method of claim 1, wherein the contact alloy comprising nickel, platinum, aluminum, titanium and the semiconductor element comprises a Ni(Pt)—Ti—Al alloy with Si or SiGe.

9. A method of forming a contact to a semiconductor device comprising:
   forming a nickel and platinum semiconductor alloy at a base of a via opening on a contact surface of the semiconductor device;
   forming a titanium layer deposited in the via opening in contact with the nickel platinum semiconductor alloy, wherein the titanium layer is in direct contact with a dielectric material of a sidewall of a via opening;
   depositing an aluminum containing layer atop the titanium layer; and
   applying an anneal to a material stack including the aluminum containing layer, the titanium layer and the nickel and platinum semiconductor alloy, the anneal including a dissociated ammonia atmosphere to getter oxygen, wherein said applying the anneal provides a contact alloy comprising elements selected from the group consisting of nickel, platinum, aluminum, titanium, and combinations thereof, and a semiconductor element from the contact surface of the semiconductor device selected from the group consisting of silicon, germanium and combinations thereof, wherein the contact alloy comprises aluminum in an amount greater than 40 at. %, nickel in an amount less than 30 at. %, silicon in an amount ranging from 5 at. % to 20 at. %, and germanium in an amount ranging from 0 at. % to 15 at. %.

10. The method of claim 9, wherein the contact surface of the semiconductor device comprises a source/drain region comprising a type IV semiconductor selected from the group consisting of silicon, silicon germanium and a combination thereof.

11. The method of claim 10, wherein nickel and platinum semiconductor alloy is formed by a method comprising:
    depositing a nickel and platinum alloy atop a surface of the source/drain region comprised of the type IV semiconductor; and
    annealing the nickel and platinum alloy to interfuse metals from the nickel and platinum alloy with the type IV semiconductor to form said nickel platinum semiconductor alloy comprising a metal silicide, metal germanosilicide or a combination thereof.

12. The method of claim 11, wherein the depositing the nickel and platinum alloy comprises a deposition process selected from the group consisting of sputtering, plating, electroplating, electroless plating, atomic layer deposition (ALD), chemical vapor deposition (CVD) and combinations thereof.

13. The method of claim 12, wherein the titanium layer is deposited using e-beam physical vapor deposition.

14. The method of claim 13, wherein the titanium layer has a thickness of 100 Å or less.

15. The method of claim 9, wherein said annealing comprises a temperature ranging from 300° C. to 450° C., and a time period ranging from 1 minute to 20 minutes.

16. The method of claim 9, wherein the contact alloy comprising nickel, platinum, aluminum, titanium and the semiconductor element comprises a Ni(Pt)—Ti—Al alloy with Si or SiGe.

17. A method of forming an alloy comprising:
    forming a nickel and platinum semiconductor alloy;
    forming a titanium layer in contact with the nickel platinum semiconductor alloy, wherein the titanium layer is in direct contact with a dielectric material of a sidewall of a via opening;
    forming an aluminum containing layer in contact with the titanium layer; and
    applying an anneal to a material stack including the aluminum containing layer, the titanium layer and the nickel and platinum semiconductor alloy, the anneal including a dissociated ammonia atmosphere to getter oxygen, wherein said applying the anneal provides an alloy comprising a metal element selected from the group consisting of nickel, platinum, aluminum, titanium and combinations thereof, and a semiconductor element selected from the group consisting of silicon, germanium and combinations thereof, wherein the alloy comprises aluminum in an amount greater than 40 at. %, silicon in an amount ranging from 5 at. % to 20 at. %, and germanium in an amount ranging from 0 at. % to 15 at. %.

18. The method of claim 17, wherein the alloy comprising nickel, platinum, aluminum, titanium and the semiconductor element is a Ni(Pt)—Ti—Al alloy with Si or SiGe.

* * * * *